United States Patent [19]
Seshardi et al.

[11] Patent Number: 5,208,816
[45] Date of Patent: May 4, 1993

[54] GENERALIZED VITERBI DECODING ALGORITHMS

[75] Inventors: Nambirajan Seshardi, Scotch Plains; Carl-Erik W. Sundberg, Chatham, both of N.J.

[73] Assignee: AT&T Bell Laboratories, Murray Hill, N.J.

[21] Appl. No.: 850,239

[22] Filed: Mar. 11, 1992

Related U.S. Application Data

[63] Continuation of Ser. No. 395,930, Aug. 18, 1989, abandoned.

[51] Int. Cl.$^5$ ............................................. G06F 11/10
[52] U.S. Cl. ...................................................... 371/43
[58] Field of Search ..................... 371/43, 44, 45, 37.1

[56] References Cited

U.S. PATENT DOCUMENTS

| | | | |
|---|---|---|---|
| 4,447,908 | 5/1984 | Chevillat et al. | 375/42 |
| 4,493,082 | 1/1985 | Cumberton et al. | 371/43 |
| 4,527,279 | 7/1985 | Yasuda et al. | 375/114 |
| 4,545,054 | 10/1985 | Davis | 371/43 |
| 4,606,027 | 8/1986 | Otani | 371/43 |
| 4,641,327 | 2/1987 | Wei | 375/114 |
| 4,644,564 | 2/1987 | Dolivo et al. | 375/18 |
| 4,660,214 | 4/1987 | Pahlavan et al. | 375/39 |
| 4,675,871 | 6/1987 | Gordon et al. | 371/43 X |
| 4,677,624 | 1/1987 | Betts et al. | 371/43 |
| 4,677,626 | 1/1987 | Betts et al. | 371/43 |
| 4,730,322 | 3/1988 | Pollara-Bozzola | 371/43 |
| 4,757,506 | 7/1988 | Heichler | 571/43 |
| 4,788,694 | 11/1988 | Calderbank | 375/59 |
| 4,807,253 | 2/1989 | Hagenauer et al. | 375/57 |
| 4,811,346 | 3/1989 | Battail | 371/43 |
| 4,823,346 | 4/1989 | Kobayashi et al. | 371/43 |
| 4,847,871 | 7/1989 | Matsushita et al. | 371/43 X |
| 4,862,464 | 8/1989 | Betts et al. | 371/43 |
| 4,888,775 | 12/1989 | Karabed et al. | 371/43 |
| 4,905,317 | 2/1990 | Suzuki et al. | 341/51 |

FOREIGN PATENT DOCUMENTS 20138598 10/1984 European Pat. Off. .

OTHER PUBLICATIONS

"Error Bounds for Convolutional Codes and an Asymptotically Optimum Decoding Algorithm," *IEEE Trans. on Info. Theory*, vol. IT-13, No. 2, 1966, pp. 260-269, A. J. Viterbi.

"The Veterbi Algorithm," *Proceedings of the IEEE*, vol. 16, No. 3, Mar. 1973, pp. 268-278, G. D. Forney, Jr.

"Maximum-Likelihood Sequence Estimation of Digital Sequences in the Presence of Intersymbol Interference,", *IEEE Trans. on Info. Theory*, vol. IT-18, No. 3, May 1972, pp. 363-378, G. D. Forney, Jr.

"Channel Coding With Multilevel Phase Signals," *IEEE Trnas. on Info. Theory*, vol. IT-28, No. 1, Jan. 1982, pp. 55-67, G. Ungerboeck.

"Convolutional Codes II: Maximum Likelihood Decoding," *Information and Control*, 25, Jul. 1974, pp. 222-266, by G. D. Forney, Jr.

"Convolutional Codes III: Sequential Decoding," *Information and Control*, 25, Jul. 1974, pp. 267-297, by G. D. Forney, Jr.

"Viterbi Decoding Algorithm for Convolutional Codes With Repeat Request," *IEEE Trans. on Info. Theory*, IT-26, No. 5 Sep. 1980, pp. 540-547, H. Yamamoto and K. Itoh.

(List continued on next page.)

Primary Examiner—Robert W. Beausoliel, Jr.
Assistant Examiner—Allen M. Lo
Attorney, Agent, or Firm—William Ryan; Katharyn Olson

[57] ABSTRACT

A data transmission system and method for processing speech, image and other data disclosed which embodies parallel- and serial-generalized Viterbi decoding algorithms (GVA) that produce a rank ordered list of the L best candidates after a trellis search. Error detection is performed by identifying unreliable sequences through comparison of the likelihood metrics of the two or more most likely sequences. Unreliable sequences are re-estimated using inter-frame redundancy or retransmission.

23 Claims, 5 Drawing Sheets

OTHER PUBLICATIONS

"A List-Type Reduced-Constraint Generalization of the Viterbi Algorithm", *IEEE Trans. on Info. Theory,* IT-33, No. 6, Nov. 1987, pp. 866–876, T. Hashimoto.

*Digital Communications,* 1983, McGraw-Hill, New York, pp. 258–275, J. G. Proakis.

"Rate Compatible Punctured Convolutional Codes (RCPC codes) and Their Applications," *IEEE Trans. on Comm.,* vol. 36, No. 4, Apr. 1988, pp. 389–400, J. Hagenauer.

"Waveform Substitution Techniques for Recovering Missing Speech Segments in Packet Voice Communications," *IEEE Trans. Acoust. Speech, and Signal Processing,* vol. ASSP-34, No. 6, Dec., 1986, pp. 1440–1448, D. J. Goodman et al.

"New Directions in Sub-Band Coding," *IEEE Journal on Selected Areas in Communications,* vol. SAC-6, No. 2 Feb. 1988, pp. 391–409, R. V. Cox et al.

"A Sub-Band Coder Designed for Combined Source and Channel Coding," *Proc. IEEE Conf. Acoust. Speech Signal Processing,* 1988, pp. 235–238, R. V. Cox et al.

"Variable-Rate Sub-Band Speech Coding and Matched Channel Coding for Mobile Radio Channels," *Proc. 38th IEEE Vehicular Technology Conf.* 1988, pp. 139–146, J. Hagenauer et al.

FIG. 4
TRELLIO DIAGRAM
N = 5
M = 2

FIG. 5

FIG. 5A
BEST PATH
ADMISSIBLE 2nd BEST PATH

FIG. 5B
BEST PATH
INADMISSIBLE 2nd BEST PATH

FIG. 6

MAIN STATE ARRAY

| | 1 | 2 | 3 | 4 | 5 | 6 | 7 | 8 | 9 | 10 | 11 | AUXILIARY ARRAY |
|---|---|---|---|---|---|---|---|---|---|---|---|---|
| $S_0 = 00$ | 0 ← | 0 ← | 0 ← | 0 ← | 0 ← | 0 ← | 0 ← | 0 ← | 0 ← | 0 ← | 0 | 8 |
| $S_1 = 01$ | - | 2 | 2 | 2 | 2 | 2 | 2 | 2 | 2 | 2 | | 7 |
| $S_2 = 10$ | 0 | 0 | 0 | 0 | 0 | 0 | 0 | 0 | 0 | | | 8 |
| $S_3 = 11$ | - | 2 | 2 | 2 | 2 | 2 | 2 | 2 | 2 | | | 6 |

| | 1 | 2 | 3 | 4 | 5 | 6 | 7 | 8 | 9 | 10 | 11 |
|---|---|---|---|---|---|---|---|---|---|---|---|
| RELEASED BEST | 0 | 0 | 0 | 0 | 0 | 0 | 0 | 0 | 0 | 0 | 0 |
| RELEASED 2nd BEST | 0 | 0 | 0 | 0 | 0 | 1 | 0 | 0 | 0 | 0 | 0 |

GENERALIZED VITERBI DECODING ALGORITHMS

This application is a continuation application Ser. No. 07/395,930, filed on Aug. 18, 1989, now abandoned.

FIELD OF THE INVENTION

This invention relates to coding and decoding of digital information for transmission over a communication channel.

BACKGROUND OF THE INVENTION

Channel coding is a means to efficiently introduce redundancy into a sequence of data symbols to promote the reliability of transmission. Two principal techniques employed are block and convolutional coding. See, for example, *Error Control Coding—Fundamentals and Applications* by S. Lin and D. J. Costello, Prentice-Hall, 1983.

BLOCK CODES

Binary block codes are generated by appending n-k check bits to k information bits to form a block of n-bits for transmission on a communications channel. These n-bit blocks are typically then applied to the channel using standard modulation methods e.g., amplitude, frequency, phase or pulse modulation. At the receiver end of the channel, after demodulation, estimates of the original k information bits are made using the received sequence including the redundancy introduced by the n-k check bits.

Decisions as to the n-bits received can be made by any of a number of schemes, some of which use unquantized estimates of the received bits (soft decision decoding) and others of which use quantized estimates of the received bits (hard decision decoding). Practitioners have found that block codes, though straightforward to implement, present some difficulty when efficient soft decision decoding is sought to be accomplished.

On an additive white Gaussian noise channel, hard decision decoding (using binary quantization of received values) results in a performance loss of about 2-3 dB as compared to soft-decision decoding. That is, the power requirement at the transmitter can be lowered by 2-3 dB when using soft-decision decoding. See *Principles of Digital Communication and Coding*, A. J. Viterbi and J. K. Omura, McGraw-Hill, 1979.

It is well known to utilize the minimum Hamming distance structure of a block code for combined error correction and error detection with hard decision decoding. This may be accomplished using a process of incomplete decoding, where the decoder does not attempt to decode every received word that is in error. Thus, error detection is achieved by a failure to decode. Methods exist to perform improved error detection and correction for block codes without a significant increase in complexity when coarse soft decisions (logical zero, logical one or an erasure) are available at a channel output. See, for example, *Error Control Techniques for Digital Communication*, by A. M. Michelson and A. H. Levesque, John Wiley & Sons, New York, 1985.

CONVOLUTIONAL CODES

Convolutional codes are generated by passing an information sequence through a shift register, stages of which are connected to linear algebraic function generators. The outputs of the function generators are then selectively combined to produce the coded output sequence.

The Viterbi Algorithm (VA) for the decoding of convolutional codes was introduced by A. J. Viterbi, "Error Bounds for Convolutional Codes and an Asymptotically Optimum Decoding Algorithm," *IEEE Trans. on Info. Theory*, Vol. IT-13, pp. 260-269, 1967. The algorithm is also described in G. D. Forney, Jr., "The Viterbi Algorithm" *Proceedings of the IEEE*, Vol. 16, pp. 268-278, 1973.

Forney in "Maximum Likelihood Sequence Estimation of Digital Sequences in the Presence of Intersymbol Interference," *IEEE Trans. on Info. Theory*, Vol. IT-18, pp. 363-378, 1972, also showed that the VA is a maximum likelihood decoding algorithm for trellis codes and used it for equalizing channels with intersymbol interference. The VA has also been used for demodulation of trellis-coded modulation. See, G. Ungerbock, "Channel Coding With Multilevel Phase Signals," *IEEE Trans. on Info. Theory*, Vol. IT-28, pp. 55-67, January 1982. The VA has also been used for demodulation of partial response continuous phase modulation. See J. B. Anderson, T. Aulin and C-E. Sundberg, *Digital Phase Modulation*, Plenum Press, NY, 1986.

Thus, it can be seen that the VA is used to advantage not only in decoding convolutional codes but also with a variety of other codes and other transmission techniques, all of which can be generally characterized by a trellis-like structure.

Even with low decoding complexity, good results have been obtained with convolutional codes using soft demodulation outputs, and maximum likelihood decoding with the VA. See the Lin and Costello reference, supra. Normally, convolutional codes are used for continuous data transmission. However, by framing data into blocks, and terminating the blocks, convolutional codes can be used to design non-systematic block codes, which can then be decoded optimally by the VA.

Unlike block codes, however, the maximum likelihood decoder for convolutional codes and other trellis-based structures is complete in that it decodes every received sequence. Thus decoders for convolutional codes lack the ability to signal a warning in the event of a potential decoding error. The present invention improves such maximum likelihood decoders by including means to signal a potential decoding error.

Various generalizations of the standard VA have been presented in the literature. In "Convolutional Codes II: Maximum Likelihood Decoding," *Information and Control*, 25, pp. 222-266, July 1974 and "Convolutional Codes III: Sequential Decoding," Inf. Control, 25, pp. 267-297, July 1974, Forney proposed a list-of-2 maximum likelihood decoder, limited for the purpose of obtaining insight into the analysis of sequential decoding techniques.

In "Viterbi Decoding Algorithm for Convolutional Codes with Repeat Request," *IEEE Trans. Info. Theory*, IT-26, pp. 540-547, September, 1980, Yamamoto and Itoh proposed an ARQ algorithm which signals for repeat request whenever the best path into every state at some trellis level is 'too close' to the second best path into every state. However, they do not find or explicitly utilize the globally second best path, and lesser best paths in their ARQ strategy. The Yamamoto, Itoh algorithm has been successfully employed in a concatenated coding scheme. The inner code is a convolutional code with soft Viterbi decoding. The outer code is a Reed-Solomon code which corrects errors and erasures, with the symbol erasure information being supplied at the inner decoder output by the use of a generalized Viterbi algorithm.

In "A List-Type Reduced-Constraint Generalization of the Viterbi Algorithm," *IEEE Trans. Info. Theory*, IT-33, pp. 866-876, November, 1987, Hashimoto has proposed a list type reduced-constraint generalization of the Viterbi algorithm which contains the Viterbi algorithm and the so-called M-algorithm as special cases. The purpose of this algorithm is to keep the decoding complexity to be no more than that of the conventional Viterbi algorithm, and to avoid error propagation due to reduced state decoding. Again no explicit use of the survivors other than the best is made after final decoding, and thus it is not a list decoding algorithm.

SUMMARY OF THE INVENTION

The present invention provides a family of generalized Viterbi algorithms (GVA). These GVAs are applied in the present disclosure to the soft or hard decoding of convolutional codes, but they apply equally well to block codes and other codes, various modulation techniques, and other trellis-based structures. More specifically, the GVAs are used in the illustrative embodiments disclosed herein to perform combined error detection and correction for convolutionally encoded data with unquantized soft decisions from the demodulator.

In accordance with one aspect of the present invention, data are transmitted in blocks of a fixed size referred to as frames. Measurements and decisions are made separately from frame-to-frame at the decoder. As in the case of the traditional VA decoder, the GVA decoder of the present invention releases the maximum likelihood (ML) sequence. However, it also attaches a flag to the decoded frame to indicate if the decision is reliable (correct with high probability) or unreliable. This reliability determination is based on the measured likelihood of correctness for the most likely sequence as compared with the likelihood of the second most likely sequence and, optionally, sequences of successively lower likelihood. When an output is so flagged and the data are representative of speech signals, then a preferred frame decoding is made based on inter-frame redundancy. Likewise, for a non-speech data communication system, the erasure information can be used to signal for frame repeat from the transmitter.

Alternatively, the GVA can release the best L candidates in the event of an erasure. The inter-frame redundancy is then used to select the best candidate for speech decoding from the L released candidates.

Another application of the GVA of the present invention is in automatic repeat request (ARQ) systems. In this application, a block of data is first encoded using additional parity bits in standard fashion. The entire augmented block (data and parity bits) is then encoded using a convolutional code amenable to decoding by the GVA techniques of the present invention. If the best candidate produced at the receiver by the GVA proves to have the correct parity as determined by standard parity checking techniques, then the data bits are determined to be correct. If the best candidate from the GVA decoding yields an incorrect result upon parity checking, then the GVA decoder is queried for the second best candidate. If this second best candidate successfully passes the parity checking, then its data bits are adjudged to be correct. In prior art techniques, a time consuming retransmission would be required to provide a new candidate for parity checking. The use of third-best and succeeding candidates can likewise be used to avoid the need for retransmission when "better" (ostensibly more likely) candidates fail to produce a correct result when parity checked.

BRIEF DESCRIPTION OF THE DRAWING

FIG. 5, consisting of FIGs. 5A and 5B, shows graphic representations facilitating the identification of second best paths in accordance with one aspect of the present invention;

DETAILED DESCRIPTION

Definitions

Throughout the following description, the terms "frame" and "block" will be used in parallel. That is, for speech transmission "frame" will be used to represent one processed segment (typically 16 ms) of speech with additional overhead for channel coding. For sub-frames and for data transmission, the term "block" will be used.

The term "Generalized Viterbi Algorithm" (GVA) means a generalization of the well-known Viterbi Algorithm which, in accordance with the present invention, is able to release a list of the L best candidate decodings corresponding to a (typically noisy) frame (or block) of convolutional coded data. The generalizations of the VA embodied in the GVA will be described more particularly below.

A parallel GVA is one that simultaneously identifies all L candidates, while a serial GVA iteratively releases the lth candidate based on the knowledge of the previous l−1 best candidates.

Soft-decision decoding refers to the assignment at the receiver of one of the set of possible code sequences based on unquantized (or incompletely quantized) information at the output of the channel demodulator. Thus, for example, the received noise-corrupted signal from the channel is applied to a set of matched filters corresponding to each possible code word. The outputs of the matched filters are then compared and the code word corresponding to the largest matched filter output is selected as the received code word. "Largest" in this sense typically means largest as a function of samples corresponding to each bit in the received code word.

See, for example, *Digital Communications*, by J. G. Proakis, McGraw-Hill, New York, 1983, pp. 258 et seq.

Hard-decision decoding refers to decoding of channel signals in which samples corresponding to each received bit are quantized, often to the two values, 0 or 1. See Proakis, supra, pp. 265 et seq.

Generalized Viterbi Algorithm (GVA)

Figure 1:
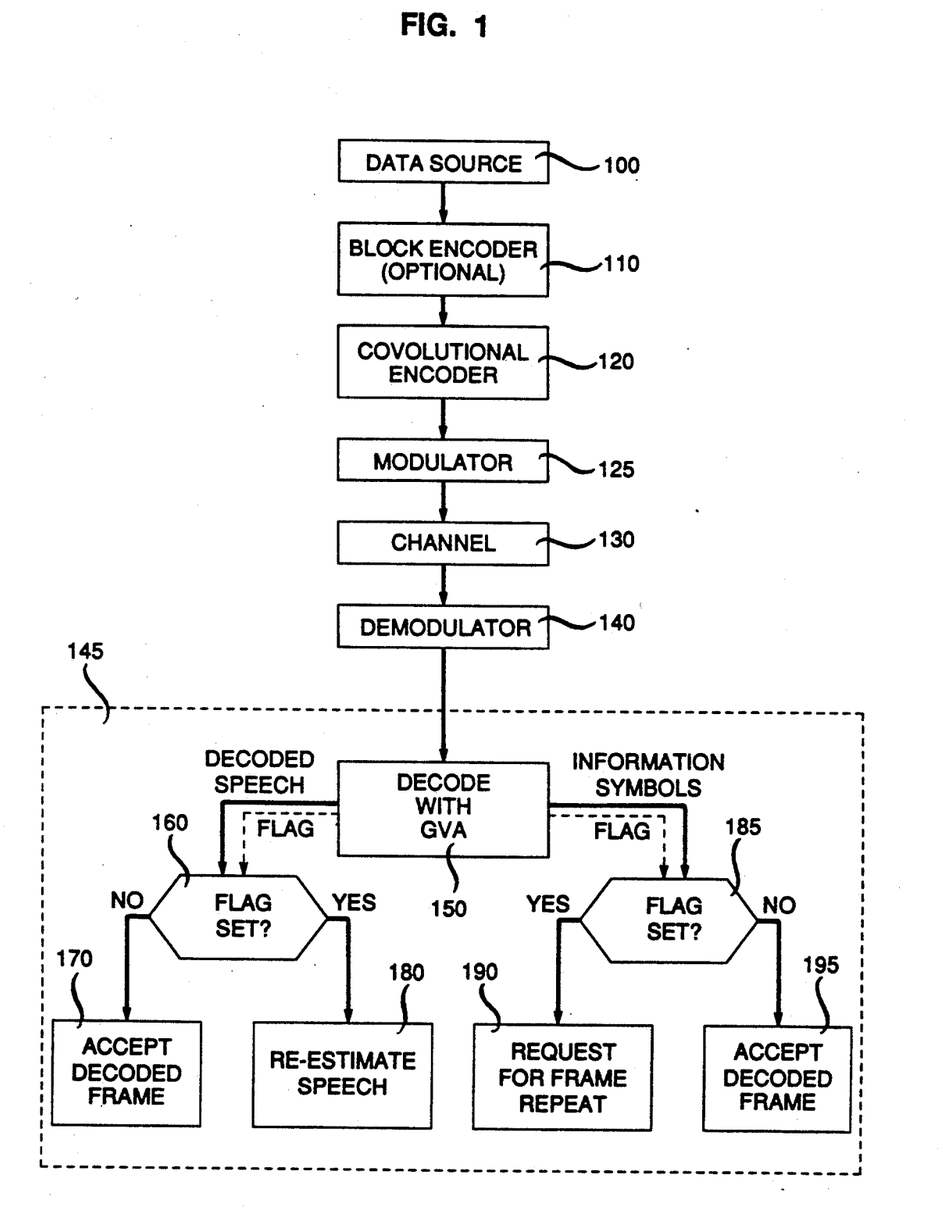
FIG. 1 shows a generalized block/flow diagram of a communications system using one embodiment of the present invention.

FIG. 1 illustrates the manner in which the GVA is employed to advantage in accordance with an important aspect of the present invention.

Shown in FIG. 1 is a system for communicating information from a data source 100 to a receiving location through a communication channel 130. If the system is to be used for speech signals, then data source 100 will include well known means for transforming such speech into frames of digital signals.

Block encoder 110 is used to add appropriate redundancy, i.e., parity check bits, to the output of data source 100 prior to presenting such data to the convolutional encoder 120. Block encoder 110 may be of any standard type described, for example, in references such as Lin and Costello, supra. Since not all applications of the present invention will use block encoding to advantage, block encoder 110 is shown as optional in FIG. 1.

Figure 2:
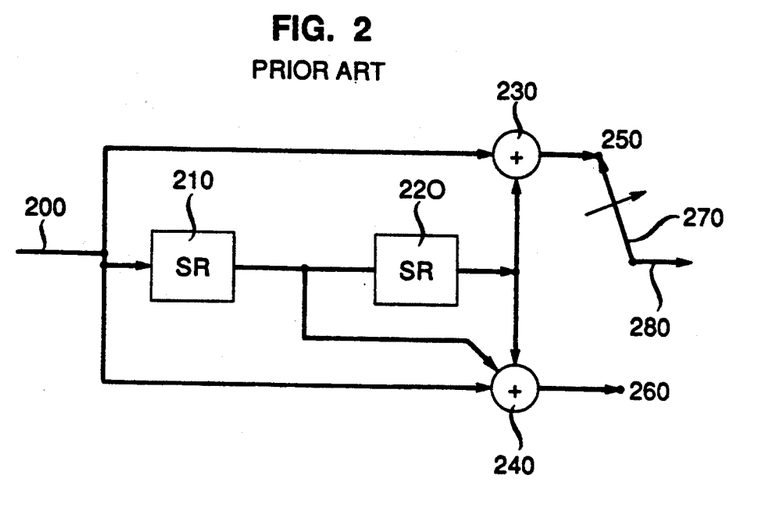
FIG. 2 shows a prior art convolutional encoder used to illustrate the present invention.

Convolutional encoder 120 is of standard design and will be chosen by the practitioner skilled in the art based on such system parameters as data rate and transmission channel characteristics. FIG. 2 shows a typical convolutional coder that will be described below to illustrate the GVA of the present invention.

Modulator 125 may be of any type suited to transmission channel 130. In general, channel 130 will exhibit noise and other impairments, e.g., frequency and phase distortion and any of a variety of fading characteristics. In appropriate cases, as when significant channel fading can be expected, it proves convenient to interleave information from adjacent frames as part of the modulation (or encoding) process. This serves to distribute the effect of a fade over a plurality of frames, thus lessening the effect on any single frame. Such techniques are well known in the art.

Demodulator 140 in FIG. 1 performs standard demodulation in a manner complementary to the modulation provided by modulator 125. The output from demodulator 140 is provided to decoder 145. Decoder 145 may, in some applications, include an optional block decoder which is complementary to block encoder 110, but this block decoder will be omitted from the present discussion in favor of a more detailed discussion below in connection with FIG. 5. Likewise, if interleaving of bits or groups of bits (symbols) is employed at the transmitter, then this process will be reversed by de-interleaving at the receiver in standard fashion. Block 150 represents the GVA operations to be described in greater detail below. For present purposes, it suffices to note that decoder 150 provides a maximum likelihood candidate for the data sequence actually transmitted by data source 100. In addition, decoder 150 also provides an indication (or flag) to indicate whether or not that candidate is significantly more likely than another possible candidate available at the decoder.

If the information being communicated is speech information, the decoded frame of speech information will be processed in accordance with the functionality represented by decision block 160 and blocks 170 and 180. If the information communicated is arbitrary (non-speech) data, then the operations indicated by blocks 185, 190 and 195 will pertain. In either case, a test is made for the presence of a flag indicating the degree of reliability to be attributed to the candidate data sequence.

When the test indicated at block 160 yields a "no flag set" result, the candidate sequence (the decoded frame of speech information) is accepted. If a flag is found, the frame is not accepted. Instead, a reestimation of the frame of speech information is undertaken. This is typically accomplished using the redundancy that exists from frame to frame in speech communication. Particular techniques for such reestimation will be discussed below.

In like manner, when non-speech information is being processed and no flag is set when the test indicated by block 185 is performed, then the frame of non-speech information is accepted. If a flag is found to be set when the test indicated by block 185 is made, then corrective action, typically a request for retransmission of the block to be sent back to the transmitting location is employed. This is shown as 190 in FIG. 1. A preferred alternative using intra-frame redundancy introduced by block-encoder 110 will be described below.

Implementation of the GVAs

The techniques for implementing the parallel and serial versions of the GVA will now be described. For the parallel GVA algorithm, the task of identifying the L most likely candidates is achieved in one pass through a trellis having a structure which differs somewhat from that associated with the conventional Viterbi algorithm. The serial algorithm is implemented using successive passes through a trellis structure which has essentially the same complexity as that associated with the normal Viterbi algorithm.

The algorithms are explained for the example of a rate $R=\frac{1}{2}$ convolutional code with 4 states. Generalization to other codes follows easily. Throughout, the discussion will proceed (without loss of generality) using framed convolutional codes, where the trellis associated with convolutional codes terminates into one known state. This is achieved by adding M known information bits (typically 0's) at the end of the data block, in standard fashion.

Referring then to FIG. 2, the example encoder is shown. An input sequence of bits is applied one bit at a time to input 200. These bits pass into shift register stage 210 and, in turn, into shift register stage 220. Exclusive-OR circuits 230 and 240 receive as inputs the inputs and outputs of the shift register stages as shown in FIG. 2, with their outputs appearing on nodes 250 and 260, respectively. Multiplexer 270 samples these output nodes (node 260 first) during each input bit period. Thus multiplexer 270 provides output bits at node 280 at twice the rate at which input bits are supplied at input node 200. This defines the rate $R=\frac{1}{2}$. The input data takes on values of 0 and 1 with equal probability. The output of the channel coder is mapped onto symbols $+1$ and $-1$ according to the mapping: $0 \rightarrow +1$; $1 \rightarrow -1$.

More generally, a convolutional coder can be characterized in terms of the 3-tuple (n,k,M) where n is the number of output bits for every k input bits, and M is the number of k-bit stages in the shift register. Using this characterization, the coder of FIG. 2 is a (2, 1, 2) coder.

As is well known, the operation of convolutional coders can be completely described in terms of either a trellis diagram or a state diagram or table. See, e.g., the Lin and Costello reference or the Proakis reference, supra.

Figure 3:
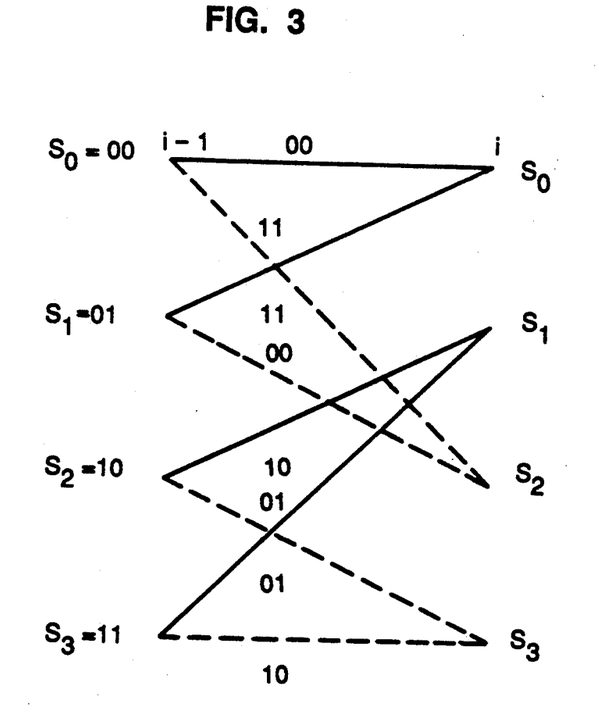
FIG. 3 shows the state diagram for the convolutional coder of FIG. 2.

FIG. 3 shows the state diagram (equivalent to the ith stage of the corresponding trellis) for the coder of FIG. 2. Since there are two shift register stages, there are 4 possible states—identified as $S_0$ through $S_3$ and associated with the respective bit patterns 00, 01, 10, and 11 shown in FIG. 3. Because the encoder of FIG. 2 is a binary convolutional coder, there are two branches entering and leaving each state. The input bit determines the state transitions. The trellis section of FIG. 3 is denoted the ith trellis level (corresponding to transition from a state at time i−1 to another at time i).

Figure 4:
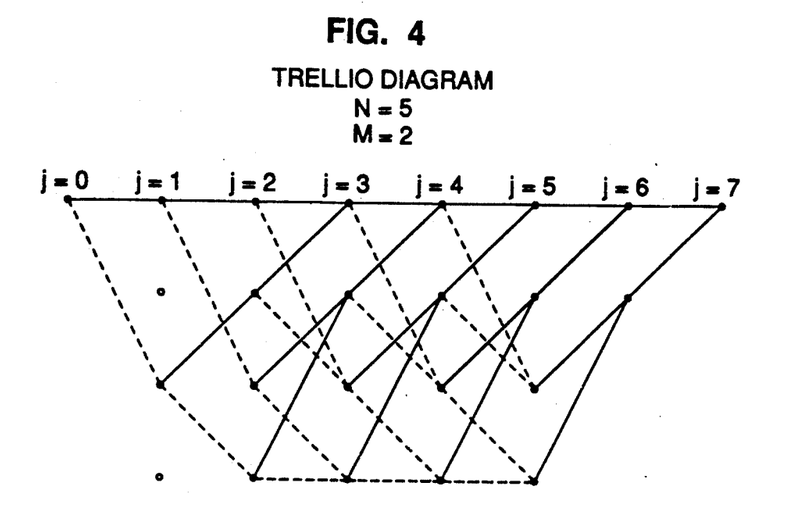
FIG. 4 shows the complete trellis diagram for the coder of FIG. 2 for a typical coding.

The full trellis for the coder of FIG. 2 for a code of length N where N is the number of k-bit information sub-blocks (k=1 in the example) is shown in FIG. 4. At each stage i, the upper branch leaving a state at time i corresponds to an input of 0, while the lower branch corresponds to an input of 1. The trellis can be seen to have a number of stages equal to N+M+1, or 8 for the cited example. As assumed, the encoding of a sequence always starts with state $S_0$ and returns to $S_0$. Thus for an input sequence 0000000 (five information bits and M=2 zero-valued "tail" bits to complete the frame), the encoded sequence produced by the encoder of FIG. 2 is 00 00 00 00 00 00 00.

As is usual in descriptions of coding and other contexts which are conveniently described in terms of trellis structures, it proves convenient to use the all-zero sequence as typical. The results that follow are not thereby limited in generality.

The input sequence into the convolutional encoder is $$u = (u_1 \ldots u_N)$$

where $u_i$ is a k-bit sub-block. u is coded after termination into a sequence v $$v = (v_1 \ldots, v_{N+M})$$

where $v_i$ is an n-bit sub-block. The termination at the output consists of M known n-bit sub-blocks.

The coded sequence is then transmitted over the channel and received as $$r = (r_1, \ldots r_{N+M}).$$

In decoding r, the Viterbi algorithm calculates the log-likelihood function log P(r|v) known as the metric associated with the path v in the trellis associated with the code being used. This metric is conveniently calculated as the sum of the individual branch metrics log P(r|v) corresponding to the branches of the path v. The partial path metric for the first j branches of a path is then calculated as $$\sum_{i=1}^{i=j} \log P(r_i | v_i)$$

Viterbi taught that the maximum likelihood sequence (i.e., that associated with the maximum likelihood path through the trellis) can be found by processing r in an iterative manner, one branch at a time. At each step, the metrics of all paths entering each state are compared, and the path with the largest metric (the survivor) is stored, as is its metric. The detailed computations employed in arriving at the most likely candidate for the transmitted sequence can be found in references such as the Lin and Costello book, supra, and will not be repeated here.

The description thus far assumes a memoryless channel. However, if the channel has memory, then a technique known as interleaving may be used to distribute the signals (e.g., bits) from one frame to nearby frames as noted above. This has the effect, upon disinterleaving at the receiver, of distributing errors that may have erased or very seriously deteriorated the useful information from one, or even a few adjacent, received frames. Thus, when such channels are encountered, it proves convenient to consider that the modulator 125 in FIG. 1 incorporates this well-known interleaving function prior to actual channel modulation. Similarly, demodulator 140 includes in those cases the reverse of this interleaving to restore the order of signals to that prior to modulation.

It should also be noted that in channels exhibiting memory, the metrics for the partial and complete paths through the trellis will, in general, not correspond to measures of maximum likelihood, but rather to some other equally satisfactory measure of quality or goodness. Such metrics are well-known in the art for many common applications.

Parallel GVA

The steps performed in computing the L most likely transmitted sequences for a given noisy received sequence will now be described using the parallel GVA. An important finding upon which the GVA is based is that in order to find the globally L best decoded candidates, it is necessary and sufficient to find and retain the L best candidates into each state at every level.

This finding will be proven for the case of L=2. In particular it will be shown that to release the two best global paths (i.e., paths traversing the entire trellis), it is necessary and sufficient to find and retain the two best paths into each state at every trellis level.

The necessary condition follows from the fact that the globally second best path is distinct from the globally best path over at least a portion of the trellis. Ultimately it remerges with the best path at some time. If the second best path into the state where this remerging occurs (which is not known a priori) is not found, then the globally second best path is not known at all.

The sufficient condition follows from the fact that the third best candidate (or lower) cannot be a survivor for being the second best at any state since there exists a candidate, namely the second best with a better metric.

The processing required to calculate the two best paths will now be described.

Decoding begins at time i=0, where the accumulated metrics of the best and the second best path to be found are initialized to zero for the known starting state, and to a very large negative value for the remaining states. Let us assume that at time i−1, the two most likely paths into $S_0^{(i-1)}$ (the super-script denotes the time) have been found. At time i, there are four paths arriving at $S_0^{(i)}$, two from each of $S_0^{(i-1)}$ and $S_1^{(i-1)}$. The extension from $S_0^{(i-1)}$ to $S_0^{(i)}$ involves the calculation of the incremental metric which is given by $$\Delta\lambda = r_{i1} \cdot x_{i1} + r_{i2} \cdot x_{i2}$$
$$= r_{i1} + r_{i2}$$

where $r_{i1}$ and $r_{i2}$ are the received symbols (real numbers) and $x_{i1}$ and $x_{i2}$ are the trellis branch symbols (+1 or $-1$; $+1$, $+1$ for transition from $S_0^{(i-1)}$ to $S_0^{(i)}$ at trellis level (or stage) i. The incremental metric is added to the accumulated metrics of the two survivors at $S_0^{(i-1)}$, thus giving the total accumulated metrics for the two paths extended from $S_0^{(i-1)}$ to $S_0^{(i)}$. Similar calculations are performed during the extension of the two paths from $S_1^{(i-1)}$ to $S_0^{(i)}$.

Out of the four extensions, the two paths with the highest accumulated metrics are chosen and retained for further extension from $S_0^{(i)}$. Similar calculations are performed at all other states. Finally, the trellis will terminate in a known state and the two surviving paths that terminate in that state are released as the most likely and the second most likely candidates (with path metrics in that order). They are called the best and second best path.

The extension of this example to the algorithm for finding the L most likely candidates requires that the L most likely candidates be found for each state and at every level. For the binary, rate 1/n (n≧2) convolutional code there are 2L paths arriving at each state out of which the best L are selected.

Generalization to high rate codes with a nonbinary trellis is readily accomplished. See, e.g., S. Benedetto et al, *Digital Transmission Theory*, Prentice Hall, Englewood Cliffs, N.J., 1987, for a discussion of such high rate codes. Likewise, application of these techniques to high rate convolutional codes based on punctured codes is straight-forward. See, Hagenauer "Rate Compatible Punctured Convolutional Codes (RCPC codes) and Their Applications", *IEEE Trans. Comm.*, Vol. COM-36, pp. 389-400, April 1988, for discussion of such codes.

Implementation Considerations for the Parallel Algorithm

It proves convenient in carrying out the parallel GVA to maintain L arrays of size $2^M \times (N+M)$, where $2^M$ is the number of states and N is the number of information bits per frame. The $ij^{th}$ entry in the $l^{th}$ array is denoted as $E_{ij}^l$, $1 \leq i \leq 2^M$, $1 \leq j \leq (N+M)$. $E_{ij}^l$ is a record of the history of the lth best path at state $S_{i-1}$ and at time instant j. The history for this path is completely specified by (i) the state occupied by the path at time $j-1$, and
(ii) the relative ranking the relative ranking among the best l survivors for the state occupied by the path at time $j-1$.

This information is evaluated during the first "forward" pass of the algorithm. The second step is essentially a back-tracking step, where we release the lth best candidate, where the first information bit that is released corresponds to trellis level N, and the last bit that is released corresponds to trellis level 1 (time reversed sequence).

Figures 5, 5A, 5B:
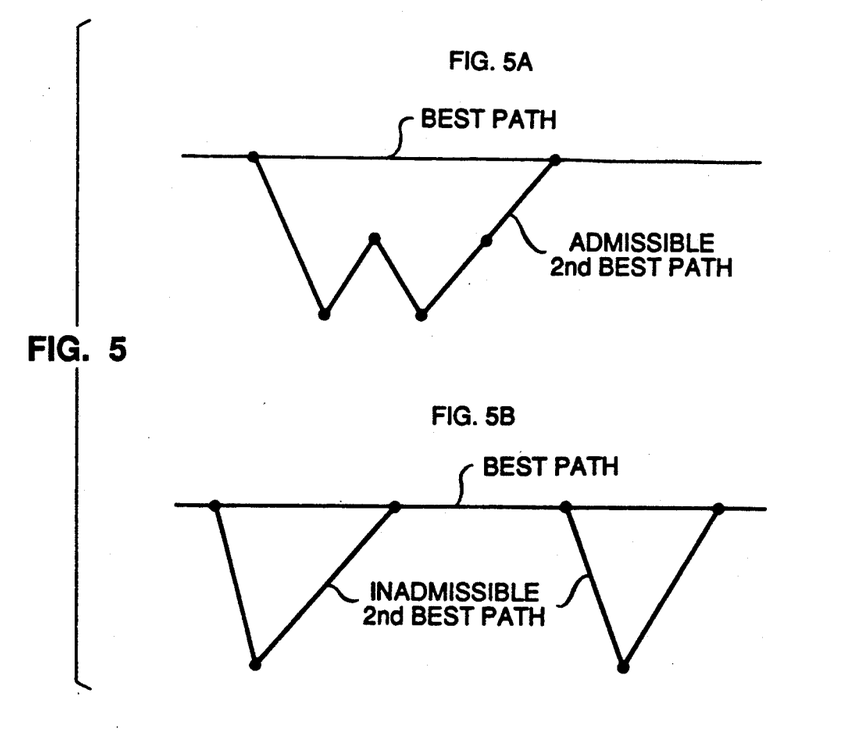

The following alternative implementation results in reduced storage for finding the second best path. The implementation is based on the fact that the second best path, after a divergence from the best path, re-merges at a later time and never diverges again as shown in FIG. 5A. This is because after re-merging, the best path has the highest metric over the remaining trellis span. A divergence from the best path after such re-merging (as in FIG. 5B) would result in a candidate with an associated metric that is smaller (worse) than the candidate without divergence.

With this in mind, it proves convenient to maintain two arrays, a main path state array of $2^M \times (N+M)$ and an auxiliary array of size $2^M \times 1$. The entry $E_{ij}$ in the main path state array is a summary of the history of the best path that terminates in state $S_{i-1}$ at time j. The history is uniquely specified by the state occupied by this path at time $j-1$.

The $i1^{th}$ entry in the auxiliary array is denoted as $E_{i1}'$. The element $E_{i1}'$ is the time instant at which the second best path into state $S_{i-1}$ at a given level has re-merged with the best path through the same state for the first time. This information is updated at every time instant. (As above, time instants are associated with trellis stages or levels.) Finally, the trellis will terminate in a known state, the all zero state.

The released second best path is the same as the best path from $E_{11}'$ to $(N+M)$, $E_{11}'$ is the time instant at which the second best path into the all zero state finally merges with the best path into this state. At $E_{11}'$, the released state for the second best path is the one that is different from that for the best. Since there are only two states from one level that extend into a state at the next level, this step of releasing can be done uniquely. At instant $E_{11}' - 1$, the back-tracking portion of the algorithm switches to the main array and continues along the history of the state released at $E_{11}'$ for the second best path.

Figure 6:
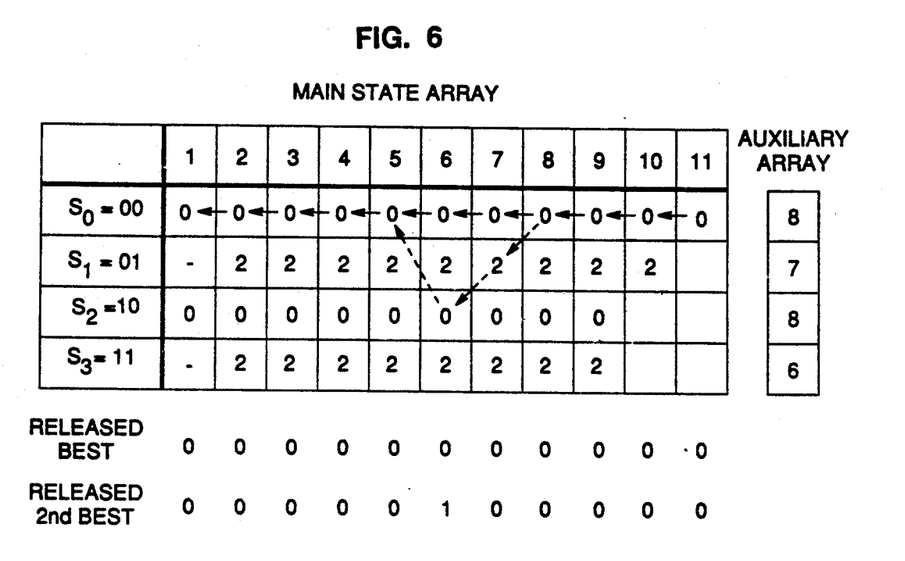
FIG. 6 shows tabular information useful in practicing one embodiment of the present invention.

This alternative implementation is demonstrated through the example in FIG. 6 for a rate ½ code, where the best sequence is the all zero path. Back-tracking is shown for the best path by solid arrows pointing from right to left. The updated auxiliary array points out, that the second path diverges from the best path at time instant $j=8$. Here, the released state for the best path is $S_0$, and hence for the second best path it is $S_1$. At $j=7$, the released state for the second best is $S_2$. At $j=6$, the released state is $S_0$, at this point, the second best path has merged with the best path (in a backward sense) and the subsequent states that are released are the same as that of the best path.

This implementation assumes a rate $R=1/n$ code. For a general $R=k/n$ code, there are $2^k$ paths entering each state. So, $E_{11}'$ contains the information indicated above for the $R=1/n$ code, but also contains information about the state from which the second best path remerged with the best path.

Computational Requirements

The factors affecting the speed of execution are the metric calculations, and the selection of the L best candidates into each state at every trellis level. To illustrate a typical computational process, it can be seen that at every level, 4 incremental metrics must be evaluated for an $R=\frac{1}{2}$ code. Each of these requires two multiplications and one addition. The metric for the L survivors from each state are updated thus requiring L additions of the previously accumulated metrics to the incremental metric. A total $2^{M+1}L+4$ additions and 8 multiplications are therefore required to be performed at every trellis level for the $R=\frac{1}{2}$ code.

In addition to the above metric calculations, for every state, the L best candidates out of the 2L incoming candidates must be selected. This requires exactly L pairwise metric comparisons, since the 2L candidates are in two ordered lists of size L. As an example, for $L=4$, there are two ordered lists with metrics, say, $a_1 > b_1 > c_1 > d_1$ and $a_2 > b_2 > c_2 > d_2$. $a_1$ and $a_2$, are first compared and if $a_1 > a_2(a_2 < a_1)$ then the candidate with metric $a_1(a_2)$ is declared to be the best. Next to be compared are $b_1$ and $a_2$, then $b_2$ and $a_1$, etc. It can be readily verified that exactly four pairwise comparisons are needed in this case.

Serial Generalized Viterbi Algorithm

Figure 7:
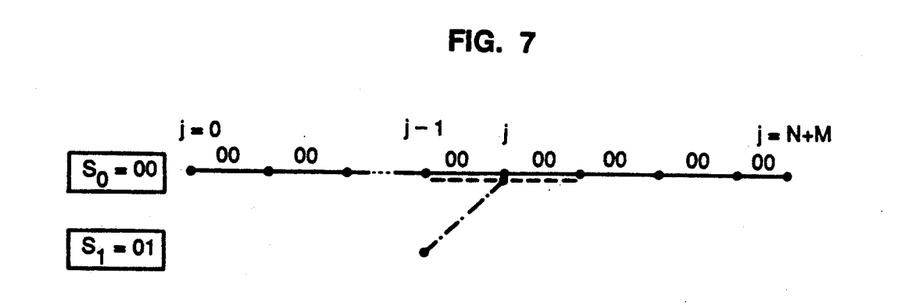
FIG. 7 is a part of a trellis diagram illustrating the identification of second best paths in accordance with one embodiment of the present invention.

The serial version of the generalized Viterbi algorithm computes the L most likely candidates one at a time, beginning with the most likely path. During the first run, the normal Viterbi search is performed to identify the most likely path. In that process, the main state array is constructed. At the end of this pass, the best way of reaching any state at any level from a known starting state has been found. Suppose the most likely candidate is the all zero path. This is shown as a solid path in the partial trellis shown in FIG. 7. The remaining $L-1$ most likely paths must still be found.

To find the globally second best path among all possible candidates that merge with the best all zero path at a time j, the one with the highest metric is selected. This is done sequentially, starting at $j=0$, and proceeding on to $j=N$. Isolating the all-zero state at time j, to find such a candidate, the second best candidate that survives at time $j=1$ is extended to time j. This candidate is shown by the dotted line in FIG. 7.

Second, we find the best among all possible candidates that re-merge with the all zero path at time j for the first time (not already merged with the all zero path at time $j-1$). This candidate is shown by the dot-dashed line in FIG. 7. Note that this candidate was a contender for being the globally best and was rejected in favor of the all zero path. Hence its history has already been recorded during the first run (the normal Viterbi search).

The best of the two candidates then remain in contention for being the second best at time j. The candidate that survives at the end is the globally second best. During this search procedure, all that needs to be recorded is the time instant at which the second best path re-merges again with the best. This is stored in an auxiliary array of size $1 \times 1$. This should be contrasted to the parallel algorithm needing an auxiliary array of size $2^M \times 1$. Based on the main state array which is filled during the normal Viterbi search and the auxiliary array information, the second best path can be found as explained for the parallel algorithm.

Figure 8:
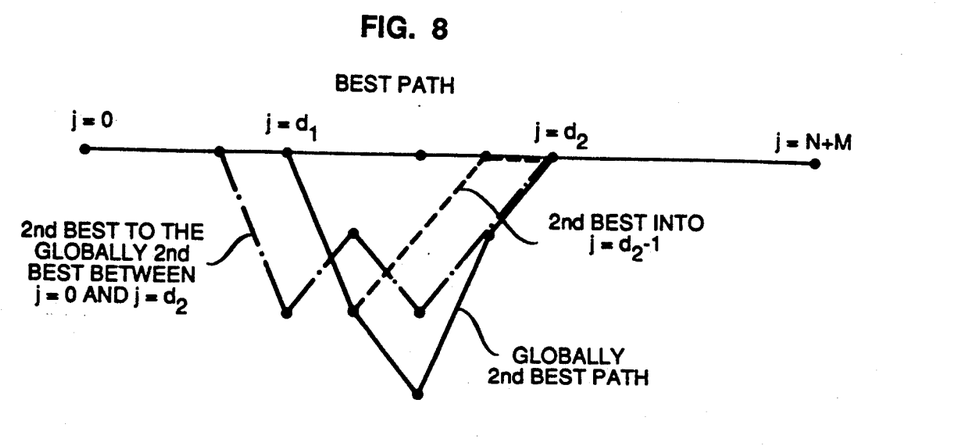
FIG. 8 shows another aspect of identifying second best paths in accordance with one embodiment of the present invention.

It is illustrative to go through one more example, that of finding the third best, after which the methodology will be generalized. FIG. 8 shows the globally best and the second best paths. The second best path re-merges with the best for the first time at $j=d_2$ after an initial divergence at $j=d_1$. The basic calculations that are performed at each time instant j along the best path are as follows: the best candidate that survives at $j-1$ for being the globally third best is extended to time j. Second, we find the best among all the paths contending to be the globally third best, and re-merging with the globally best path at j (not already merged at time $j-1$).

The two candidates are compared and the best of the two survives for further extension. We note that for the events in FIG. 8, the candidate that survives at $j=d_2-1$ for being the third best is in fact the second best candidate into $j=d_2-1$. This is so because this (third best) candidate is not a part of the globally second best candidate. This path is extended to $j=d_2$ and is one of the two candidates in contention for being the third best at $j=d_2$. The other contender is the best among all the candidates re-merging into $j=d_2$ excluding the globally second best candidate. Thus, this contender is the second best to the globally second best path between $4=0$ to $j=d_2$. since it is now known how to calculate the second best to a path, this can be done. The best of the two survives for further extension. It should be clear by now that a recursive implementation emerges where the task of finding the $l^{th}$ best candidate is broken into the task of finding a $k^{th}$ best candidate between two nodes, $k<l$.

To generalize, to find the $l^{th}$ best candidate, at each instant j along the best path, the best available candidate for this position is extended from $j-1$. Also the best available candidate for this position re-merging with the best path at instant j (and not at $j-1$) is found. The best of the two contenders survives for further extension.

While this description is for a $R=1/n$ code, for $R=k/n$ the only modification required is that the auxiliary array also contains information about the state from which the second best path merged into the best path.

Thus, the general statement of the serial GVA can be summarized in the following steps:

1. Initialize $l=0$.
2. (a) Create a state sequence array which contains the state sequence of the l best survivors already found (array of size $Lx(N+M)$).
   (b) Form a state count array of size $2^M x(N+M)$. The $ij^{th}$ element of this array $C_{ij}$ is the number of paths among the globally l best candidates that pass through state i at time j. (When $l=0$, both the state sequence and state count arrays are empty.)
3. Increment l by 1.
4. Perform the parallel GVA, while retaining the $C_{ij}+1$ paths with the highest metrics into state i at time unit j. At the end, i.e., when $j=N+M$, the $(l+1)^{th}$ best candidate is found, along with all the l previously found globally best candidates.
5. Go to step 3 until $l=L$.

Note that this serial GVA, unlike the parallel algorithm, does not require that the L best paths into each state be found at every time unit j.

Application of GVA to Error Control the description above details algorithms which identify the L best paths through a terminated trellis. These algorithms will now be applied to perform error detection with framed convolutional codes.

Error detection can be performed using the GVA by comparing the difference in the metrics of the most likely and the second most likely paths, and declaring the most likely path to be unreliable if the difference is less than a preset threshold T.

The metric can be optimum as for maximum likelihood decoding or it can be another "reasonable" metric as might appear in various engineering solutions to an ad hoc suboptimum decoder. Beyond this, the choice of a metric is not critical for to the GVA or its application to error detection. The path corresponding to the largest accumulated metric value is (with such a reasonable choice of metric) the most likely path, also referred to as the best path. The path with the second largest metric is called the second best path. Likewise, paths with progressively smaller metrics are referred to as the third best, fourth best, etc.

Thus, "most likely" should be understood to mean not only most likely (maximum likelihood) in a probablistic sense, but also that (path, candidate, etc) exhibiting a maximum in some reasonable "goodness" sense.

As is known from the prior art, an erasure may be declared upon detection of an error in a frame containing speech information and the erased frame is re-estimated based on inter-frame speech redundancy. This can be done at the waveform level, as described by D. J. Goodman, "Waveform substitution techniques for recovering missing speech segments in packet voice communications, " *IEEE Trans. Acoust. Speech, Signal Processing*, Vol. ASSP-34, pp. 1440–1448, Dec. 1986. Alternatively, the re-estimation can be done at the bitstream level using, e.g., quantized information about spectral parameters of speech like those relating to energy in frequency bands which are expected to maintain some relationship from frame to frame.

In accordance with the present invention, the flagging of a received sequence (frame) as unreliable can cause the received sequence to be treated as an erasure. In the event of such an erasure, the L best candidates are released by the GVA and inter-frame redundancy is used to select the best from the L candidates. This can be done by using the speech redundancy to produce an initial estimate of the erased frame. This is then used as a reference for selecting which of the L candidates is the best to output using a selection rule that is appropriate for the given speech coder.

For example, in so-called sub-band coders with dynamic bit allocation (D-SBC) described in Cox et al, "New Directions in Sub-Band Coding," *IEEE Journal on Selected Areas in Communications*, Vol. SAC-6, No. 2, pp. 391–409; Cox et al, "A Sub-Band Coder Designed for Combined Source and Channel Coding," *Proc. IEEE Conf. Acoust., Speech, Signal Processing*, 1988, pp. 235–238; and Hagenauer et al, "Variable-Rate Sub-Band Speech Coding and Matched Channel Coding for Mobile Radio Channels," *Proc. 38th IEEE Vehicular Technology Conf.* pp. 139–146, the inter-frame redundancy can be used to re-estimate a present frame based on the previous frame. In particular, if a D-SBC coded frame is determined to be erased, the one of the L candidates available from the GVA of the present invention that is closest to the sequence immediately preceding the erased frame can be used as a re-estimate of the erasure. This "closeness" can be based, e.g., on high correlation for some bit positions in a frame-to-frame comparison.

Error detection can also be performed without explicit evaluation of the second most likely path if all that is desired is information as to whether the most likely candidate is reliable or unreliable. A slight modification of the ordinary Viterbi algorithm accomplishes this objective. This implicit error detection is enough to initiate re-estimation for speech signals as described above.

In a serial version, one proceeds in the same manner as when using the Viterbi algorithm thus identifying the best candidate. The process then proceeds sequentially, starting from the known state, to find if the best alternative that remerges for the first time with the best path at $j$, $j=1, 2, \ldots, N$, has a metric that is different from the best metric by less than an established threshold amount. If at any stage along the search, such a candidate is found, then the best path is declared to be unreliable.

Figure 9:
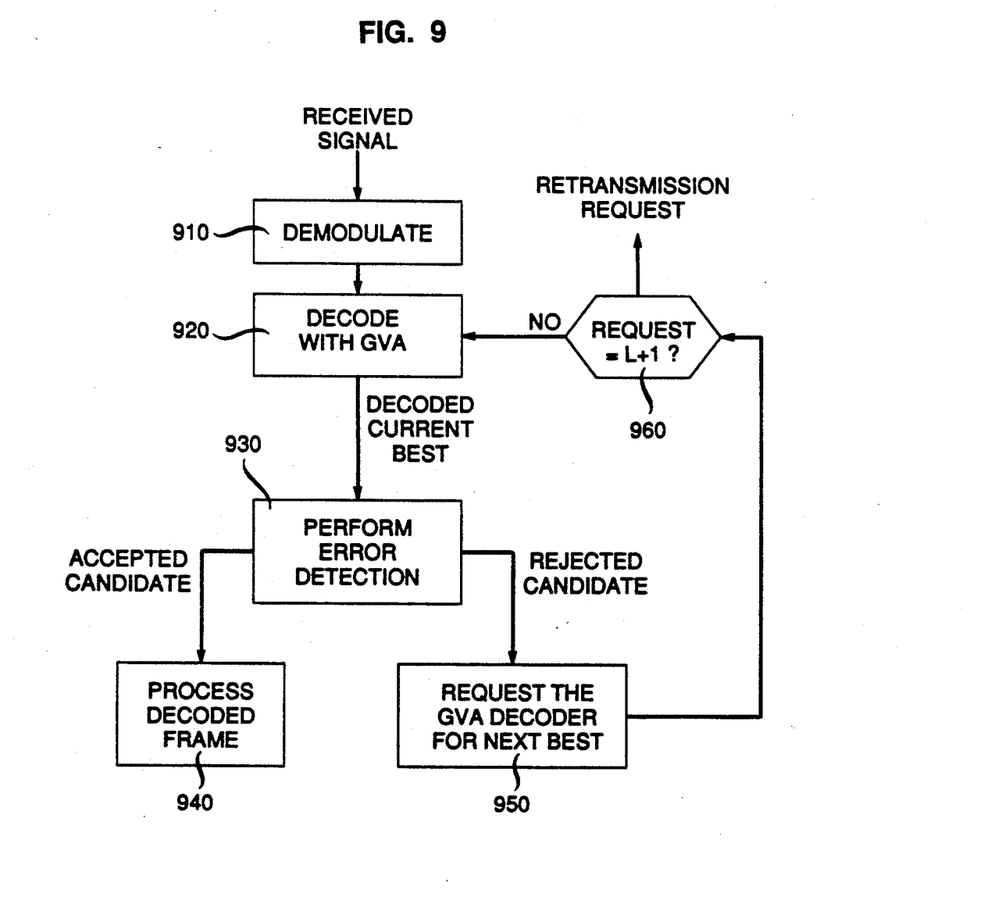
FIG. 9 shows how the GVA of the present invention can be used to reduce the number of retransmission requests required in systems using retransmission of blocks to effect error correction.

Finally, the automatic repeat request (ARQ) application for the GVA that was introduced above will now be elaborated on. Reference is made to FIG. 9, where a flow diagram for a typical ARQ system is shown.

A received signal sequence from the channel is seen entering demodulator 910 for reversing the modulation applied at the transmitter in substantially the same manner as shown in FIG. 1. The demodulated sequence is then processed by GVA decoder as indicated by block 920 shown in FIG. 9. The GVA decoder can be any of the several variations described above. It will only be assumed that the GVA provides the L best candidate sequences.

In typical ARQ systems it proves advantageous to also include redundant bits with the source sequence, which redundant bits represent the parity bits of an appropriate block code. Thus, after decoding by the GVA a subsequent block decoding is accomplished as indicated by block 930 in FIG. 9.

If the block decoding is accomplished without an error indication, i.e., the parity bits are found to be appropriate for the most likely sequence made available by the GVA, then the block-decoded version of the most likely sequence provided by the GVA is assumed to be the sequence that was sent. This sequence is sent, as indicated by block 940, for further processing by the utilizing application, e.g., speech or date processing.

If, however, the block error decoding represented by block 930 in FIG. 9 indicates that an error has occurred, then a request is sent to the GVA decoder for the next most likely transmitted sequence. This second most likely sequence is then decoded by the block decoder and, if error free, is sent for processing as the sequence originated at the transmitting location. If the second most likely sequence provided by the GVA is also found to be in error, a request may then be made for the third most likely sequence, and so forth, until an error-free decoded block is found to be suitable for delivery as indicated by block 940 in FIG. 9.

In the event that no sequence decoded by GVA decoder 920 is found to be free of error after examining some number L of the most likely sequences, then a request for a retransmission is sent back to the transmitting location as indicated by decision block 960. It should be noted, however, that having the most likely candidate sequences available for evaluation by the block decoder greatly increases the probability that the correct sequence will be identified. This has the salutary effect of greatly reducing the number of retransmission requests that are necessary.

The above description has proceeded using individual techniques well known to those skilled in the art. The methods and algorithms have been described without reference to a particular processor or control program. Instead, the individual steps have been described in such manner that those skilled in the art can readily adapt such processors, modulators, programming languages and the like as may be available or preferable for particular applications.

While the above description has used decoding of convolutional coding as an example of the potential application of the GVA of the present invention, it should be emphasized that the techniques have application beyond convolutional codes. In particular, processing of signal sequences which have been encoded in other ways, e.g., block codes, or have been subject to various modulation techniques (e.g., trellis-coded modulation or continuous phase modulation, or subject to channels exhibiting the traditional frequency, amplitude, phase or other processing—including equalizers to compensate for channel effects) can be accomplished using the present invention. A unifying characteristic of all of these and other applications is the use of a trellis structure to describe the states of the processing at each of the relevant times during decoding. See, for example, U.S. Pat. No. 4,807,253 issued to Hagenauer and Sundberg on Feb. 21, 1989 for a further discussion of trellis-structured contexts where the present invention will prove useful.

The above description of the present invention has used processing of speech signals as a typical application, especially when inter-frame redundancy can be used to advantage. However, it should be understood that the present invention will find application in numerous other contexts, including many where such frame-to-frame redundancy can be expected. Thus, as is well known, much coded information characterizing visual images contains substantial redundancy. Likewise, audio signals other than speech also often contain useful inter-frame redundancy, as do facsimile signals. In each case the redundant information can be used in a manner equivalent to that described above for processing of coded speech signals.

Typical of image-based information susceptible of processing in accordance with the present invention is information represented by coding techniques described in U.S. patent application Ser. No. 350,435, entitled "Perceptually-Tuned Sub-Band Image Coder," filed on May 5, 1980 by J. D. Johnston and R. J. Safranek. Additionally, coding of the type described in U.S. patent application Ser. No. 272,860, entitled "Data Coding for Image Transmission Using Vector Quantization," filed on Nov. 11, 1988 by T. Kim may be advantageously processed in accordance with the present invention. Each of these latter patent applications is assigned to the assignee of the present application.

We claim:

1. A method of processing a coded information sequence received from a transmitter comprising,
   determining the value for a metric indicative of the relative quality for each of the L ($>1$) best candidates to be selected as the sequence actually transmitted,
   wherein said candidates each correspond to paths through a trellis structure having a plurality of stages and a plurality of states at each stage,
   wherein each path entering each state at each stage has a partial metric associated with it,
   wherein said determining comprises finding the L paths through said trellis which have the highest sum of partial metrics,
   said determining further comprises recognizing at each stage of the trellis the L paths entering each state that have the highest cumulative metric at that stage, and
   retaining such recognized paths as partial paths leading to the L paths through the trellis having the largest sum of partial metrics.

2. The method of claim 1 further comprising
   identifying as unreliable the candidate having the highest value for said metric whenever said highest value differs from the value for said metric for another of said L sequences by less than a predetermined amount.

3. The method of claim 2 further comprising
   accepting the candidate having the highest value for said metric as the sequence transmitted when it is not identified as being unreliable, and
   re-estimating a transmitted sequence when the candidate having the highest value for said metric is identified as being unreliable.

4. The method of claim 3 wherein said re-estimating is accomplished using redundant information in said sequences.

5. The method of claim 4 wherein said re-estimating is accomplished by using information about one or more previously received sequences.

6. The method of claim 4 wherein said coded information contains speech information.

7. The method of claim 4 wherein said coded information contains visual image information.

8. The method of claim 3 wherein
   said information sequences are encoded using at least an outer code to introduce redundant information,
   said processing includes the further step of decoding said outer code, and
   wherein said re-estimating is accomplished by selecting as the transmitted sequence that one of said L candidates which most nearly reflects an error-free decoding of said outer code.

9. The method of claim 8 wherein
   said outer code is a block code, and wherein
   said re-estimating is further accomplished by selecting that one of said L candidates which upon decoding of said outer code yields a self-consistent set of parity signals.

10. The method of claim 1 wherein
    said step of determining comprises finding the L candidates having the L highest likelihoods of being the sequence transmitted by said transmitter.

11. The method of claim 4 wherein
    said coded information has been coded by a convolutional coder, and
    said identifying is accomplished by comparing metrics for each of said L paths in said trellis characterizing said convolutional code.

12. The method of claim 11 wherein
    said determining comprises
    selecting the L paths entering each state for each stage of said trellis which have the highest partial metric.

13. The method of claim 1 further comprising
    requesting a repetition of a transmitted sequence when a processed sequence is found to be unreliable.

14. The method of claim 1 further comprising iteratively evaluating said L paths having the highest values for said metric.

15. The method of claim 14 wherein
    the ith best path, $i=2,\ldots,L$, is determined by selecting, for all candidate paths at stage j, and all $j=0$ to $j=N+M$ the candidate path which first merges at stage with the path having the highest value for said metric, and has the ith largest partial metric of the paths entering stage j.

16. The method of claim 14 wherein said step of iteratively evaluating comprises
    determining the path having the highest metric,
    determining, for each $l=2, 3, \ldots, L$, the trellis stage at which the lth best path remerges with the best path.

17. The method of claim 14 wherein $L=2$.

18. The method of claim 1 wherein $L=2$.

19. A method of processing received coded information sequences from a transmitter which received sequences correspond to respective paths through a trellis structure having a plurality of stages and a plurality of states at each stage comprising
    determining the value for a metric indicative of the relative quality for the best candidate to be selected as the sequence actually transmitted, and on L−1 subsequent evaluations of said metric for paths traversing the complete trellis associated with said sequences received from said transmitter, determining the metric value for the L−1 next best candidates, said subsequent evaluations comprising evaluating metrics for partial paths that remerge for the first time at a stage j of said trellis with the path for the best candidate after having diverged from said path for the best candidate, and retaining the partial paths having the best metric at stage j and discarding all others, and at the final stage selecting the path with the second best metric.

20. The method of claim 19 further comprising generating an indication that said best candidate is unreliable whenever said metric for said best path differs by less than a predetermined amount from any of said (L−1) next best candidates.

21. The method of claim 20 further comprising requesting that the transmitted sequence be retransmitted.

22. The method of claim 20 wherein L=2.

23. The method of claim 20 further comprising re-estimating the transmitted sequence whenever the best candidate is indicated to be unreliable.

* * * * *

UNITED STATES PATENT AND TRADEMARK OFFICE
CERTIFICATE OF CORRECTION

PATENT NO. : 5,208,816
DATED      : May 4, 1993
INVENTOR(S) : Nambirajan Seshadri, et al It is certified that error appears in the above-indentified patent and that said Letters Patent is hereby corrected as shown below:

On title page, item [19] "Seshardi et al." should read --Seshadri et al--
Item [75] "Seshardi" should read --Seshadri--

Signed and Sealed this

Fourteenth Day of June, 1994

Attest:

BRUCE LEHMAN

*Attesting Officer*   Commissioner of Patents and Trademarks